United States Patent
Atsumi et al.

(10) Patent No.: US 6,215,332 B1
(45) Date of Patent: *Apr. 10, 2001

(54) SEMICONDUCTOR INTEGRATED CIRCUIT HAVING POWER SUPPLY VOLTAGE DETECTING FUNCTION

(75) Inventors: Shigeru Atsumi, Yokohama; Hironori Banba, Kamakura, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,861

(22) Filed: Feb. 26, 1998

(30) Foreign Application Priority Data

Feb. 27, 1997  (JP) ..................................... 9-044246

(51) Int. Cl.$^7$ ........................................ H03K 5/22
(52) U.S. Cl. ................................. 327/63; 327/77
(58) Field of Search .................. 327/143, 77, 198, 327/63, 54, 538, 540, 543, 544, 407, 408; 323/313, 316

(56) References Cited

U.S. PATENT DOCUMENTS

| | | | |
|---|---|---|---|
| 4,945,267 | * | 7/1990 | Galbraith ............................. 327/434 |
| 5,086,238 | * | 2/1992 | Watanabe et al. ..................... 327/539 |
| 5,197,033 | * | 3/1993 | Watanabe et al. ..................... 365/226 |
| 5,349,244 | * | 9/1994 | Confalonieri ......................... 327/143 |
| 5,377,156 | * | 12/1994 | Watanabe et al. ..................... 365/227 |
| 5,382,839 | * | 1/1995 | Shinohara ............................. 327/545 |
| 5,396,116 | * | 3/1995 | Watanabe et al. ..................... 327/535 |
| 5,663,926 | * | 9/1997 | Haseo ............................... 365/230.06 |
| 5,696,465 | * | 12/1997 | Ishizuka ............................... 327/544 |
| 5,822,267 | * | 10/1998 | Watanabe et al. ..................... 365/227 |

* cited by examiner

Primary Examiner—Terry D. Cunningham
Assistant Examiner—Quan Tra
(74) Attorney, Agent, or Firm—Banner & Witcoff, Ltd.

(57) ABSTRACT

A first voltage detection circuit detects whether a value of the power supply voltage is lower or higher than a first voltage, and generates a first signal according to the detection result. A second voltage detection circuit detects whether the power supply voltage is lower or higher than a second voltage higher than the first voltage, and generates a second signal according to the detection result. A control circuit receives the first and second signals, and conducts a control in such a manner that the control circuit ceases all the functions of an internal circuit when the first signal corresponds to a case where a value of the power supply voltage is lower than the first voltage, and ceases a part of the functions of the internal circuit when the first signal corresponds to a case where a value of the power supply voltage is higher than the first voltage and the second signal corresponds to a case where the value of the power supply voltage is lower than the second voltage. The first and second detection circuits have the same circuit constitution.

44 Claims, 6 Drawing Sheets

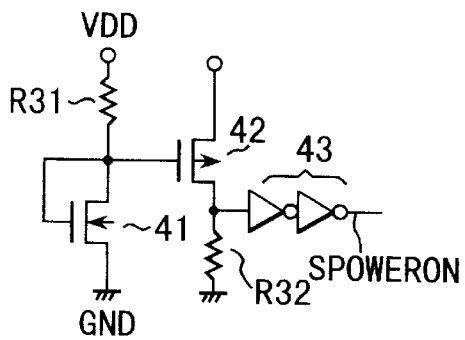
FIG. 1A (PRIOR ART)
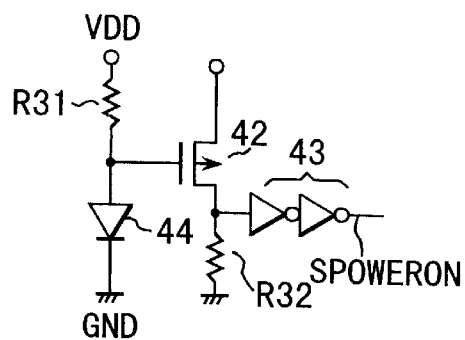
FIG. 1B (PRIOR ART)
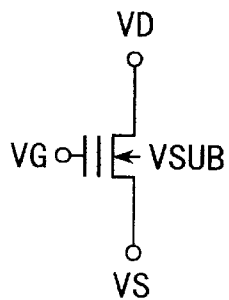
FIG. 2A
|  | VG | VD | VS | VSUB |
|---|---|---|---|---|
| READ | 5V | 1V | 0V | 0V |
| WRITE | 10V | 5V | 0V | 0V |
| ERASE | −7V | OPEN | 6V | 0V |
FIG. 2B
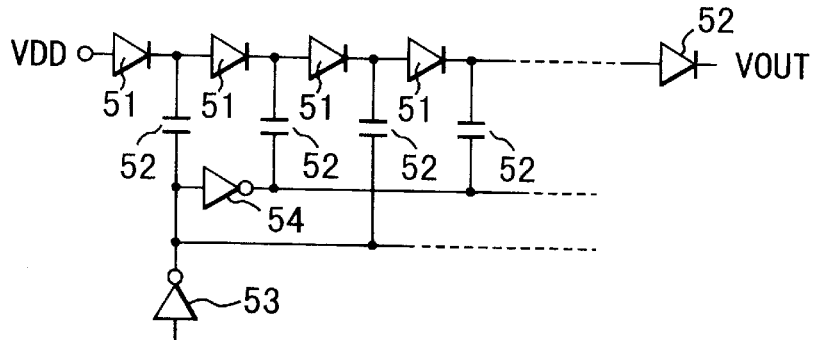
FIG. 3
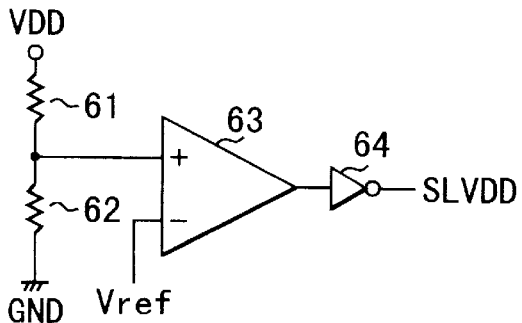
FIG. 4 (PRIOR ART)
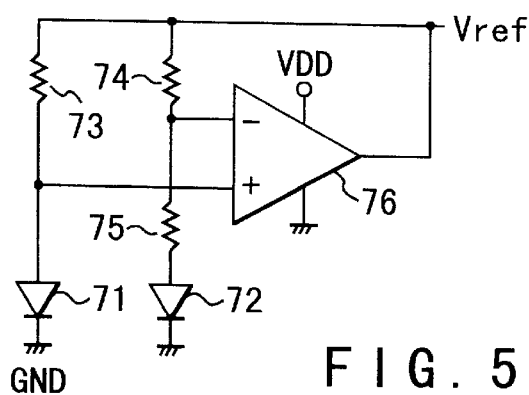
FIG. 5

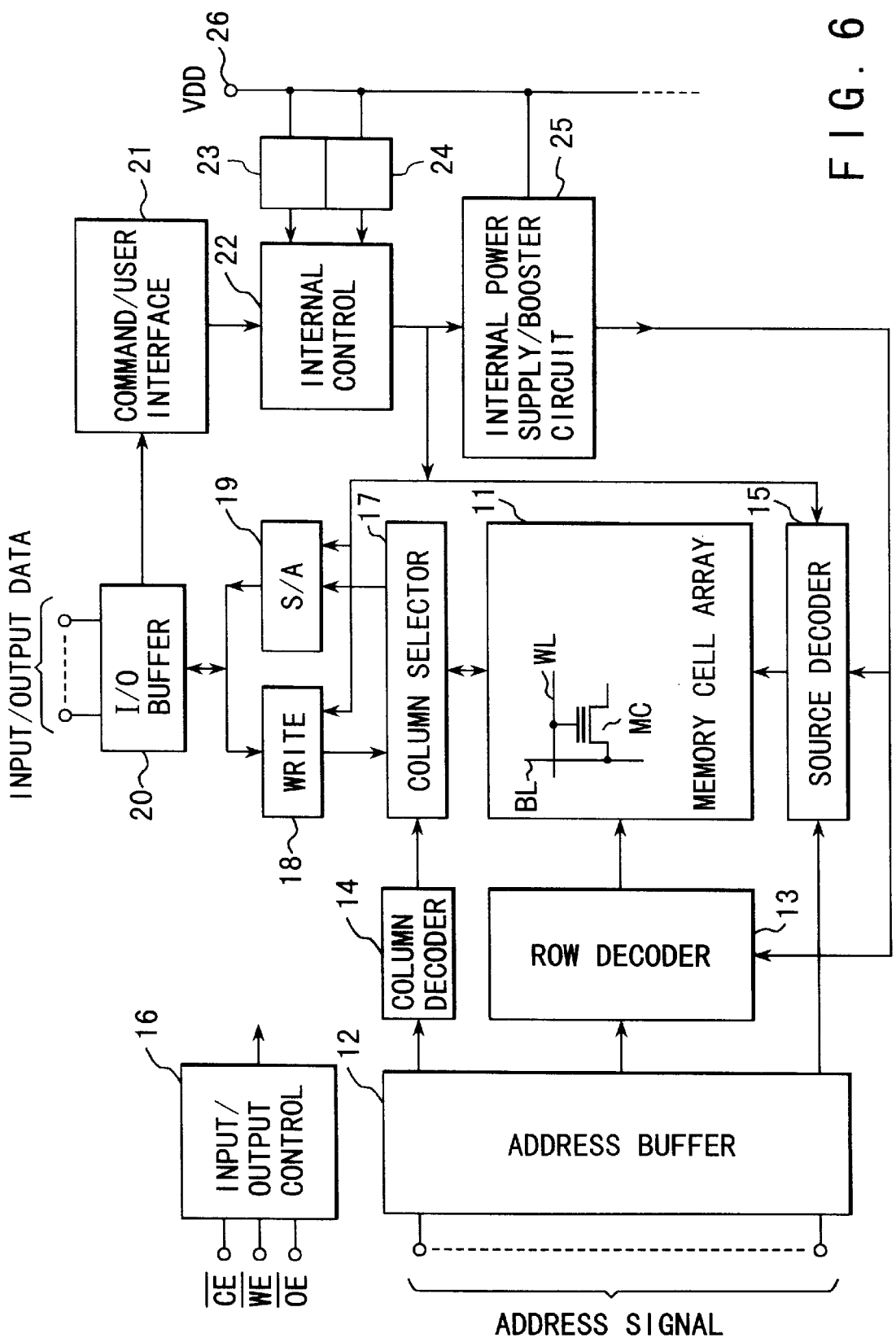
F I G. 6

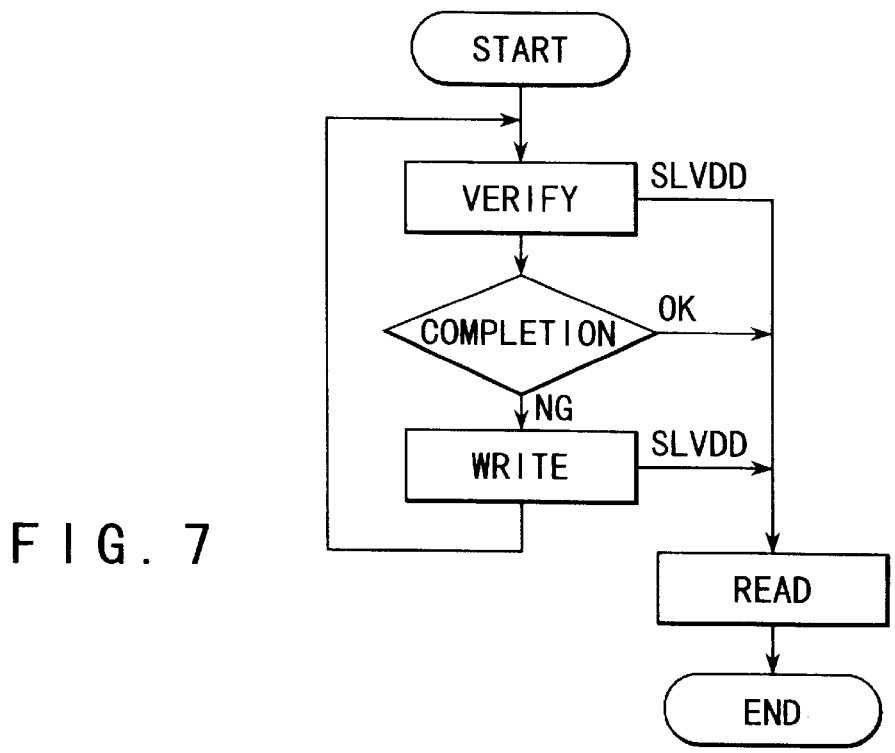
F I G. 7
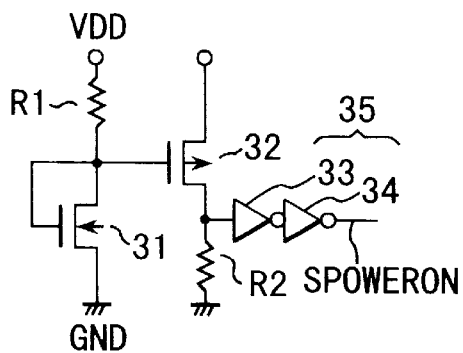
F I G. 8 A
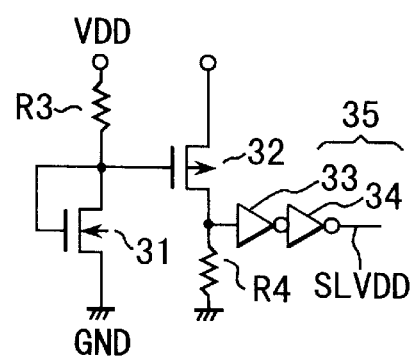
F I G. 8 B
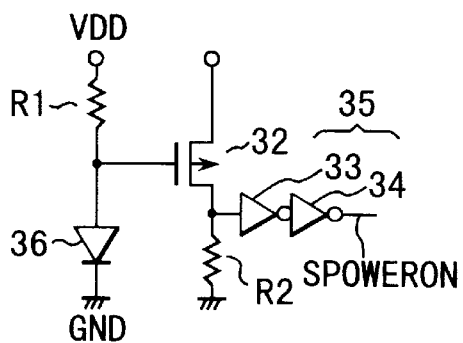
F I G. 9 A
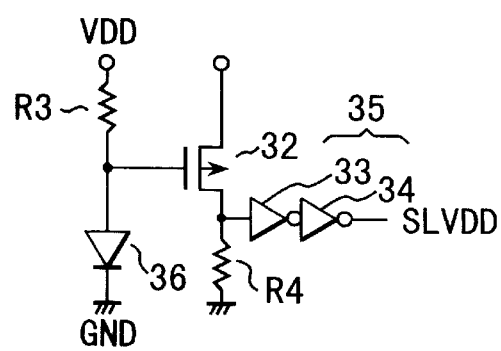
F I G. 9 B

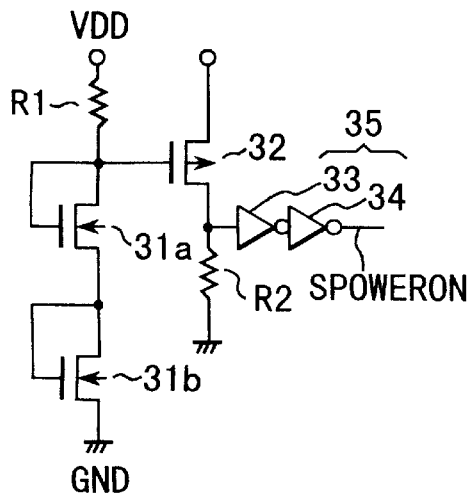
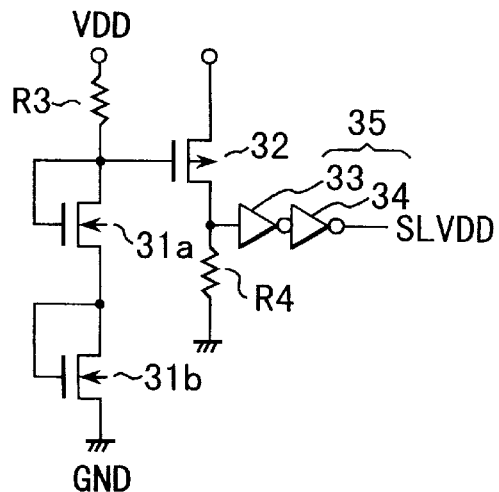
FIG. 10A                FIG. 10B
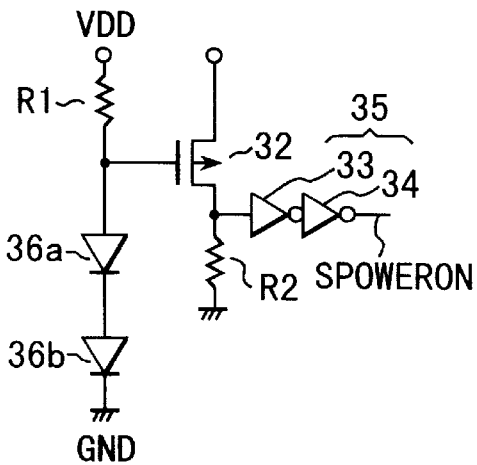
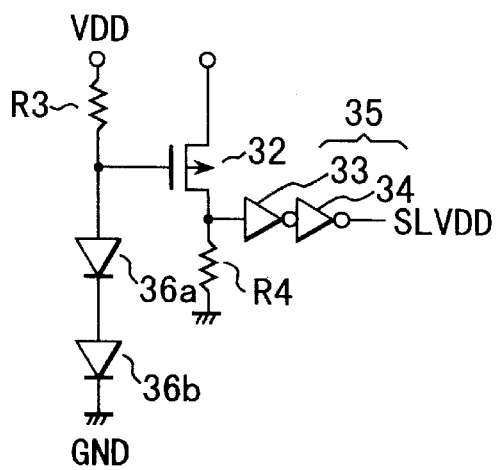
FIG. 11A                FIG. 11B
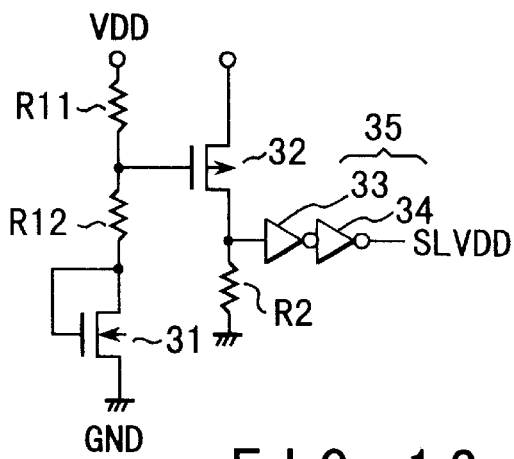
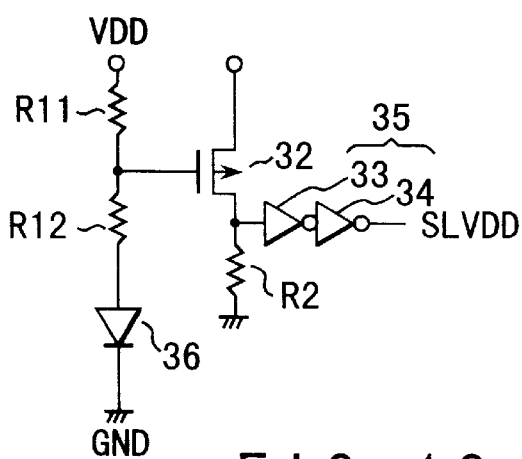
FIG. 12                 FIG. 13

SEMICONDUCTOR INTEGRATED CIRCUIT HAVING POWER SUPPLY VOLTAGE DETECTING FUNCTION

BACKGROUND OF THE INVENTION

The present invention relates to a semiconductor integrated circuit having a power supply voltage detecting function, and more particularly, a semiconductor integrated circuit, whose circuit functions are all ceased at a power supply voltage of a value or lower, while in part at a power supply voltage of a higher value, but whose circuit functions are all operable at a power supply voltage of a sufficiently further higher value, whereby a wrong operation in a state of a low voltage is prevented from occurring.

In a non-volatile semiconductor memory in which data write and electrical erase can be performed (flash memory EEPROM), its internal operations are controlled in such a manner that a power supply voltage $V_{DD}$ is detected, and during a time when a value of the $V_{DD}$ is equal to or lower than a first voltage level ($V_{POWERON}$), all the functions of its internal circuits are ceased, while during a time when a value of the $V_{DD}$ is higher than the first voltage level ($V_{POWERON}$) but still lower than a second voltage level ($V_{LVDD}$), which is lower than an operation guarantee voltage, a write/erase operation cannot be performed, though a data read operation can be performed. Thereby, wrong write and wrong erase both prevented from occurring.

That is, a flash EEPROM works as a read-only memory when a power supply voltage $V_{DD}$ is higher than a $V_{POWERON}$ level but lower than a $V_{LVDD}$ level, and data in a memory cell is not changed by a write/erase operation therein.

Since an operation is unstable when a power supply voltage $V_{DD}$ is higher than the $V_{POWERON}$ level, but it is lower than the $V_{LVDD}$ level which is a regular operation guarantee voltage level, data write and erase, which entail a change in data in a memory cell, are not performed. This is achieved in such a manner that a level of the power supply voltage $V_{VDD}$ is internally detected and a write/erase command from the outside is not accepted, if $V_{DD}<V_{LVDD}$. A write/erase operation is ceased when a state of $V_{DD}>V_{LVDD}$ is given by some influence or other, even after a write/erase operation is started by receiving an external command in a state of $V_{DD}<V_{LVDD}$ 1.

In order to perform the above mentioned control, there are a need for a circuit detecting two voltage levels of the $V_{POWERON}$ and the $V_{LVDD}$ in a chip.

Since the $V_{POWERON}$ level is a voltage level which guarantees a read operation, it is linked with an internal power supply margin. Generally, in the case of a CMOS circuit, the level has more chances to be set at a voltage of the order of the sum of threshold voltages of a p-channel MOS transistor and an n-channel MOS transistor.

FIG. 1A shows a conventional voltage detection circuit for detecting the $V_{POWERON}$ level. The $V_{POWERON}$ in the voltage detection circuit is given by $V_{POWERON}=V_{THN}+|V_{THP}|$ ($V_{THN}$ and $V_{THP}$ are respectively threshold voltages of n and p-channel MOS transistors). In this circuit, a resistor $R_{31}$ and a current path between the source and drain of an n-channel MOS transistor (hereinafter referred to as NMOS) 41 are connected in series between nodes of a power supply voltage $V_{VDD}$ and the ground potential. The gate of the NMOS 41 is connected to a connection node between an end of the current path and the resistor $R_{31}$. Besides, a current path between the source and drain of an p-channel MOS transistor (hereinafter referred to as PMOS) 42 and a resistor R32 are in series connected between the nodes of the power supply voltage $V_{VDD}$ and the ground potential. The gate of the PMOS 42 is connected to the connection node between the resistor R31 an end of the current path of the NMOS 41.

An amplifier circuit 43 is connected to a connection node between an end a current path of the PMOS 42 and the resistor $R_{32}$, wherein the amplifier circuit 43 comprises two inverters having cascade connection and produces a detection signal $S_{POWERON}$ showing that a power supply voltage $V_{DD}$ is lower or higher than a $V_{POWERON}$ through voltage amplification of a signal at the connection node.

In such a constitution, a detection signal $S_{POWERON}$ is H level when a power supply voltage $V_{DD}$ is lower than a $V_{POWERON}$ level ($V_{THN}+|V_{THP}|$) and a detection signal level is L level when a power supply voltage $V_{DD}$ is higher than the $V_{POWERON}$ level ($V_{THN}+|V_{THP}|$).

FIG. 1B shows another circuit constitution of a conventional voltage detection circuit for detecting a $V_{POWERON}$ level in a similar manner. This circuit employs a pn junction diode 44 instead of the NMOS 41 of FIG. 1A and is further different from it in that the $V_{POWERON}$ level is given by $V_f+|V_{THP}|$ ($V_f$ is a voltage drop in a forward direction of a PN junction diode).

Another voltage detection level $V_{LVDD}$ of a power supply has more chances to be determined by a power supply circuit in a write or erase operation as a factor.

FIG. 2A shows a symbolic diagram of a non-volatile transistor with a floating gate and control gate, which is used as a flash EEPROM memory cell and FIG. 2B is a table collectively showing voltages supplied to the control gate (VG), drain (VD), source (VS) and back gate (VSUB) in data read/write/erase operations of the non-volatile transistor. As shown in the figure, an operation voltage of the memory cell requires to be higher voltage, positive or negative, (10V, 6V, −7V) for a write/erase operation as compared with a read operation.

In a flash EPROM, these high voltages are internally generated, for example, by use of a booster circuit as shown in FIG. 3. The booster circuit comprises diodes 51 connected in series, and capacitors 52 and inverters 53, 54 used for boosting an anode and cathode of each diode 51 alternately with clock signals of different phases.

A value of a boosted voltage $V_{out}$ obtained in the booster circuit is strongly dependent on the number of the diodes (N) and a value of a power supply voltage $V_{DD}$ and given by the following equation:

$$V_{out} \leq N \times (V_{DD}-Vf)$$

where Vf is a voltage drop in a diode.

Therefore, the number of necessary steps (N) in a booster circuit is different according to an operation voltage for guarantee.

A relation in magnitude between $V_{POWERON}$ and $V_{LVDD}$ levels in a integrated circuit of $V_{DD}$=5V has a large difference and for example, the settings are like $V_{POWERON}$=2V and $V_{LVDD}$=3.5V.

FIG. 4 shows an example of a conventional voltage detection circuit for detecting the $V_{LVDD}$ level. Two resistors 61, 62 are in series connected between a node of the power supply voltage $V_{DD}$ and the node of the ground voltage. The power supply voltage $V_{DD}$ is divided by the two resistors 61, 62 and supplied to a non-inversion input terminal (+) of an operational amplifier 63. A reference potential $V_{ref}$ is supplied to an inversion input terminal (−) of the operational amplifier 63 and the operational amplifier 63 compares both input potentials in magnitude. A comparison output of the operational amplifier 63 is amplified by an inverter 64 and thereby a detection signal $SLV_{DD}$ of H level or L level is generated.

The above mentioned reference voltage $V_{ref}$ is a voltage which has no dependence on the $V_{DD}$ level and, for example, as shown FIG. 5, it is generated in a circuit constituted of diodes 71, 72, resistors 73 to 75 and an operational amplifier 76. The circuit is a generally known BGR (Band Gap Reference) circuit.

Now, when values of the resistors 61, 62 are respectively indicated by Ra and Rb, the detection signal $S_{LVDD}$ output from the voltage detection circuit of FIG. 4 achieves H level if the following equation is satisfied, which is:

$$VDD<\{(Ra+Rb)/Rb\}V_{ref}$$

In the case where an integrated circuit is guaranteed so that it is operable with a power supply voltage of 5V, since such a condition $V_{LVDD}>>V_{POWERON}$ can be set, it has not been considered that a relation in magnitude between $V_{LVDD}$ and $V_{POWERON}$ levels is reversed, even when there are fluctuations in respective levels of $V_{LVDD}$ and $V_{POWERON}$ However, However, in a progress toward a lower voltage in an integrated circuit, there has been encountered a case where a relation in magnitude between $V_{LVDD}$ and $V_{POWERON}$ levels is reversed in an integrated circuit in which a guarantee of $V_{DD}=2.7V$ is required or a further lower power supply voltage has to be used for operation guarantee. For example, a combination of the power supply detection circuit for a $V_{POWERON}$ level of FIG. 1A and the power supply detection circuit for a $V_{LVDD}$ level will be considered.

In FIG. 1A, a value of $V_{POWERON}(V_{THN}+|V_{THP}|)$ generally has a central value of 1.8V at room temperature. In the following, it will be analyzed in what range of voltage the value is fluctuated according to an operational temperature or a process dispersion. For example, it is assumed that a dispersion of a threshold value is ±0.1V, threshold vs. temperature characteristics are +0.1V at −40° C., 0V at room temperature and −0.1V at +100° C. The minimum value at a higher temperature for which a process dispersion of a $V_{POWERON}$ level is considered, which was 1.8V, is 1.4V, and the maximum value at a lower temperature, for which a process dispersion is considered, is 2.2V. That is, a $V_{POWERON}$ level is spread in the range of 1.4V to 2.2V with 1.8V as a central value.

On the other hand, a $V_{LVDD}$ which is a detection level in the voltage detection circuit of FIG. 4 is determined by the following equation:

$$VLVDD=\{(R1-R2)/R2\}V_{ref}$$

The $V_{ref}$ in the equation is the reference voltage generated in a BGR circuit shown in FIG. 5, and a value thereof is almost not dependent of a power supply voltage or an operational temperature and constantly assumes 1.25V. Therefore, a $V_{LVDD}$ level is not affected by a dispersion of a threshold voltage of a transistor and it is set as a constant voltage without any temperature characteristics.

In the progress toward a lower voltage as described above, wherein an operation is guaranteed at a condition $V_{DD}=2.7V$, a $V_{LVDD}$ level should be set at a lower value than that and it is required by common sense that the $V_{LVDD}$ is set on the order of 2.2V, which is on the order of 80% of $V_{DD}$ (2.7×0.8).

In this case, in the worst condition of a lower temperature, a $V_{LVDD}$ level has a chance to be lower than a $V_{POWERON}$ level. Besides, an original intention cannot be achieved that the worst guarantee voltage for a write/erase operation is set at a higher value than the lowest guarantee voltage for a read operation.

While in the above description, a non-volatile semiconductor memory (flash EEPROM) is taken up as an example of a semiconductor integrated circuit, whose circuit functions are all ceased at a power supply voltage of a value or lower, while in part at a power supply voltage of a higher value, but whose circuit functions are all operable at a power supply voltage of a sufficiently further higher value, the above mentioned problem also occurs in a semiconductor circuit whose function is controlled by detecting a power supply voltage at two voltage levels.

BRIEF SUMMARY OF THE INVENTION

It is, accordingly, an object of the present invention to provide a semiconductor integrated circuit having a power supply voltage detecting function which controls a circuit function by detecting a power supply voltage at two voltage levels, in which a relation in magnitude of the two voltage levels is not reversed by a power supply voltage level which guarantees an operation, whereby a wrong operation is prevented from occurring.

According to the present invention, a semiconductor integrated circuit having a power supply voltage detecting function is provided, the semiconductor integrated circuit comprising: a power supply terminal receiving a power supply voltage from an outside; a first voltage detection circuit, which receives the power supply voltage given to the power supply terminal, in which a detection result is obtained on whether a value of the power supply voltage is lower or higher than a first voltage, and from which a first signal according to the detection result is output; a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output; an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage, wherein the first and second detection circuits each further comprises: at least two MOS transistors, two resistors and a constitution in which the power supply voltage is detected based on a sum of threshold voltages of the at least two MOS transistors and the first and second detection circuits each further comprise a constitution in which voltages, which are different from each other, are detected according to setting of values of the two resistors.

According to the present invention, a semiconductor integrated circuit having a power supply voltage detecting function is provided, the semiconductor integrated circuit comprising: a power supply terminal receiving a power supply voltage from an outside; a first voltage detection circuit, which receives the power supply voltage given to the power supply terminal, in which a detection result is obtained on whether a value of the power supply voltage is lower or higher than a first voltage, and from which a first signal according to the detection result is output; a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output; an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of internal circuit when the first signal corresponds to a case where the value of the power supply voltage is higher than the first voltage and the second signal corresponds to a case where the value of the power supply voltage is lower than the second voltage, wherein the first and second detection circuits each comprises: one MOS transistor, at least one diode and two resistors and a constitution in which the power supply voltage is detected based on a sum of a threshold voltage of the MOS transistor and a voltage drop in the at least one diode and the first and second detection circuits each further comprise a constitution in which voltages, which are different from each other, are detected according to setting of values of the two resistors.

According to the present invention, a semiconductor integrated circuit having a power supply voltage detecting function is provided, the semiconductor integrated circuit comprising: a power supply terminal receiving a power supply voltage from an outside; a voltage detection circuit, which receives the power supply voltage given to the power supply terminal, in which a detection result is obtained on whether a value of the power supply voltage is lower or higher than a first voltage, and from which a first signal according to the detection result is output; in which a detection result is further obtained on whether the value of the power supply voltage is lower or higher than a second voltage higher than the first voltage, and from which a second signal according to the detection result is output, wherein the voltage detection circuit comprises: at least three first resistors connected in series between the power supply voltage and a first node; a first MOS transistor of a first polarity type, a current path between a source and drain thereof being connected between the first node and a node of a reference potential, and a gate thereof being connected to the first node; a second MOS transistor of a second polarity type, an end of a current path between a source and drain thereof being connected to the power supply terminal, and a gate thereof being connected to a first serial connection node located in a side closer to the first node among the serial connection nodes of the at least three first resistors; a second resistor, an end thereof being connected to the other end of the current path of the source and drain of the second MOS transistor, and the other end thereof being connected to a node of the reference potential, and generating the first signal through the end of the second resistor; a third MOS transistor of the second polarity type, an end of a current path between a source and drain thereof being connected to the power supply terminal, and a gate thereof being connected to a second serial connection node different from the first serial connection node, located in a side closer to the power supply voltage among the serial connection nodes of the at least three first resistors; and a third resistor, an end thereof being connected to the other end of the current path between the source and drain of the third MOS transistor, and the other end thereof being connected to a node of the reference potential, and generating the second signal through the end of the third resistor, and the semiconductor integrated circuit further comprising: an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage.

According to the present invention, a semiconductor integrated circuit having a power supply voltage detecting function is provided, the semiconductor integrated circuit comprising: a power supply terminal receiving a power supply voltage from an outside; a voltage detection circuit, which receives the power supply voltage given to the power supply terminal, in which a detection result is obtained on whether a value of the power supply voltage is lower or higher than a first voltage, and from which a first signal according to the detection result is output; in which a detection result is further obtained on whether the value of the power supply voltage is lower or higher than a second voltage higher than the first voltage, and from which a second signal according to the detection result is output, wherein the voltage detection circuit comprises: at least three first resistors connected in series between the power supply voltage and a first node; a diode, an end of a current path between an anode and cathode thereof being connected to the first node and the other end of the current path thereof being connected to a node of a reference potential; a first MOS transistor, an end of a current path between a source and drain thereof being connected to the power supply terminal, and a gate thereof being connected to a first serial connection node located in a side closer to the first node of the serial connection nodes among the at least three first resistors; a second resistor, an end thereof being connected to the other end of the current path of the source and drain of the first MOS transistor, and the other end thereof being connected to a node of the reference voltage, and generating the first signal through the end of the second resistor; a second MOS transistor of the same polarity type as that of the first MOS transistor, an end of a current path between a source and drain thereof being connected to the power supply terminal, and a gate thereof being connected to a second serial connection node different from the first serial connection node, located in a side closer to the power supply voltage among the serial connection nodes of the at least three first resistors; a third resistor, an end thereof being connected to the other end of the current path between the source and drain of the second MOS transistor, and the other end thereof being connected to a node of the reference potential, and generating the second signal through the end of the third resistor; and the semiconductor integrated circuit further comprising: an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are circuit diagrams of conventional voltage detection circuits;

FIG. 2A is a symbolic diagram of a non-volatile transistor and

FIG. 2B is a table collectively showing voltages supplied to the control gate, drain, source and back gate in data read/write/erase operations of the non-volatile transistor;

FIG. 3 is a circuit diagram of a booster circuit built in a flash EEPROM;

FIG. 4 is a circuit diagram of a conventional voltage detection circuit;

FIG. 5 is a circuit diagram of a Band Gap Reference circuit producing a reference potential used in the voltage detection circuit of FIG. 4;

FIG. 6 is a block diagram showing a constitution in the entire chip of a flash EEPROM according to an embodiment of the present invention;

FIG. 7 is a flow chart showing processing in a data write operation of the flash EEPROM of FIG. 6;

FIGS. 8A and 8B are circuit diagrams of voltage detection circuits used in the flash EEPROM of FIG. 6;

FIGS. 9A and 9B are other diagrams of first and second voltage detection circuits used in FIG. 6;

FIGS. 10A and 10B are further circuit diagrams of the first and second voltage detection circuits used in FIG. 6;

FIGS. 11A and 11B are still other circuit diagrams of the first and second voltage detection circuits used in FIG. 6;

FIG. 12 is another circuit diagram of the second voltage detection circuit used in FIG. 6;

FIG. 13 is still another circuit diagram of the second voltage detection circuit used in FIG. 6;

DETAILED DESCRIPTION OF THE INVENTION

Figure 14:
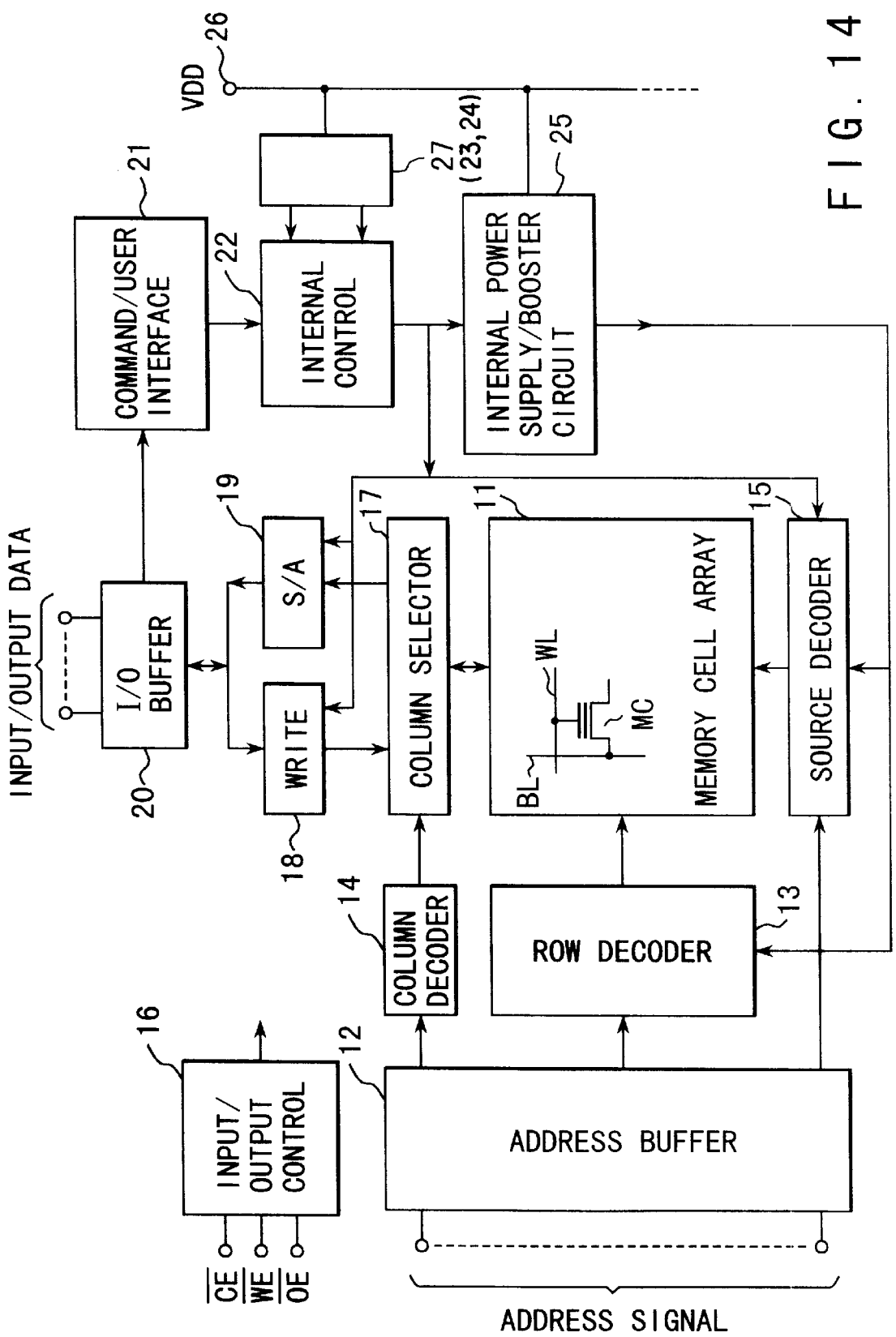
FIG. 14 is a block diagram showing the entire constitution of the inside of a chip of a flash EEPROM according to another embodiment of the present invention.

The present invention will below be described in embodiments in reference to the accompanying drawings.

FIG. 6 is a block diagram showing a constitution of the inside of a chip of a flash EEPROM according to a first embodiment of the present invention. In the figure, a memory cell array 11 comprises plural bitlines BL, plural wordlines WL (only one line is shown for each) and plural memory cells (a flash memory cell, only one is shown) MC, each of which comprises a floating gate, control gate, source and drain, wherein electrons are injected to the floating gate and thereby a threshold value thereof relative to the control gate is changed, so that data program (write) is performed and on the other hand data erase is electrically performed. The control gate of each memory cell MC is connected to one of plural wordlines and the drain thereof is connected to one of plural bitlines. The source of each memory cell is connected to, for example, a common source line (not shown) in bitline units, wordline units or block units.

An address buffer 12 generates internal address signals by receiving address signals from the outside. The internal address signals generated in the address buffer 12 are supplied to a row decoder 13, a column decoder 14 and a source decoder 15.

An input/output control circuit 16 receives a chip enable signal/CE, a write enable signal/WE and an output enable signal/OE, all input from the outside, and generates various control signals for controlling an internal operation based on the input signals. For example, a control signal based on the chip enable signal/CE is supplied to the address buffer 12. A generation operation of internal address signals is controlled in the address buffer 12 according to the control signal. A control signal based on the output enable signal/OE is supplied to an I/O buffer later described. In the I/O buffer, an output operation of data is made possible according to the control signal. A control signal based on the write enable signal/WE is supplied to a write circuit later described. In the write circuit, a write operation is made possible according to the control signal.

The row decoder 13 selects a wordline WL in the memory cell array 11 according to the internal address signals (internal row address signals).

A column selector 17 selects a bitline BL in the memory cell 11 according to a decode output from the column decoder 14.

The source decoder 15 selects a source line in the memory cell array 11 according to the internal address signals and supplies a predetermined voltage on a selected source line.

The write circuit 18 supplies write data to a selected memory cell in a data write operation and writes the data.

A sense amplifier circuit (S/A) 19 senses read data from a selected memory cell in the memory cell array 11 in a data read operation.

An I/O buffer 20 supplies data supplied from the outside to the write circuit 18 in a data write operation and outputs data sensed in the sense amplifier circuit 19 to the outside of the chip in a data read operation. To the I/O buffer 20, a command data which is used for designating respective operation modes, that is operation modes of data write/erase/read is supplied as well.

A command/user interface circuit 21 is connected to the I/O buffer 20. A control signal output from the input/output control circuit 16 is also input in the command/user interface circuit 21. The command/user interface circuit 21 receives command data input from the I/O buffer 20 at a timing when the write enable signal/WE is activated. The output of the command/user interface circuit 21 is supplied to a internal control circuit 22.

Detection signals from a first and second voltage detection circuits 23, 24 which detect a power supply voltage in addition to command data which the command/user interface circuit 21 receives are supplied to the internal control circuit 22. The first voltage detection circuit 23 detects the first voltage level $V_{POWERON}$ which ceases all the function of the internal circuit of the chip. The second voltage detection circuit 24 detects the second voltage level $V_{LVDD}$ which controls so that a write/erase operation cannot performed, though a data read operation can be performed.

The internal control circuit 22 generates internal control signals corresponding to the command data, and detection signals from the first and second detection circuits 23, 24. The internal control signals are supplied not only to the source decoder 15, the write circuit 18 and the sense amplifier circuit 19, but also to an internal power supply/booster circuit 25.

The internal power supply/booster circuit 25 receives a power supply voltage $V_{DD}$ supplied to a power supply terminal 26 from the outside of the chip and in the internal power supply/booster circuit 25, not is an internal power supply voltage generated based on the external power supply voltage $V_{DD}$ but also a high voltage of a positive polarity or a negative polarity is generated by use of a charge pump. The voltage thus generated is distributed to various circuits in the same chip. For example, a high voltage of a positive polarity is supplied to the row decoder 13, the source decoder 15 and the like and a high voltage of a negative polarity is supplied to the row decoder 13.

Operations of a flash EEPROM having such a constitution will be described in a concise manner. When data read/write/erase are performed, address signals for selecting a memory cell are supplied to the address buffer 12. When data write is performed, data for write are supplied to the I/O buffer 20. A memory cell MC in the memory cell array 11 is selected based on the address signals supplied to the address buffer 12.

FIG. 7 is a flow chart showing processing in a data write operation which is one of operation modes of the flash EEPROM of FIG. 6. When a command is input to the command/user interface circuit 21 by way of the I/O buffer 20, a boosted high voltage for data write from the internal power supply/booster circuit 25 is produced and is supplied to the row decoder 13 by control of the internal control circuit 22.

As shown in FIG. 7, verify is first performed before data write is started. The verify is a function to read data from the memory cell and thereby to check whether or not write is sufficiently performed. In a verify operation, if it is found that sufficient write is not performed, then write is again performed to the memory cell. In the data write operation, as shown in FIG. 2B, a high voltage (VG), for example of 10V is applied to the control gate of a selected memory cell for a predetermined time for write. At this point, a voltage (VD) of, for example 5V. is applied to the drain and a voltage (VS) of, for example 0V is applied to the source. After a write operation is completed, verify is again performed. As a result, if it is judged that sufficient write is not performed, a mode is returned to a write mode to complete write.

The above description is made on the case where a value of a power supply voltage $V_{DD}$ satisfies an operation guarantee voltage, that is, a detection signal corresponding to $V_{DD}>V_{POWERON}$ is generated in the voltage detection circuit 23 and a detection signal corresponding to $V_{DD}>V_{LVDD}$ is generated in the voltage detection circuit 24.

On the other hand, when data write is performed, if a state of $V_{DD}<V_{LVDD}$ is detected in the voltage detection circuit 24 and a detection signal $S_{LVDD}$ is generated in the voltage detection circuit 24, a mode is transferred to a read mode immediately even in any state. As a result, a wrong write due to a reduction in a power supply voltage can be prevented. Besides, though it is not shown in FIG. 7, if the state of $V_{DD}<V_{POWERON}$ is detected in the voltage detection circuit 23 when data write is performed and a detection signal $S_{POWERON}$ is generated in the voltage detection circuit 23, all the operations including a read operation are ceased.

In a data erase operation, if a state of $V_{DD}<V_{LVDD}$ is detected in the voltage detection circuit 24 and thereby a detection signal SVLDD is produced, a mode is transferred to a read mode immediately even in any state. Besides, if a detection signal $S_{POWERON}$ is produced in the voltage detection circuit 23 by having a state of $V_{DD}<V_{POWERON}$ detected, all the operations including a read operation.

FIGS. 8A and 8B show detailed circuit constitutions for the first voltage detection circuit 23 for detecting the $V_{POWERON}$ level and the second voltage detection circuit 24 for detecting the $V_{LVDD}$ level provided in FIG. 6.

In the first voltage detection circuit 23 shown in FIG. 8A, an end of a resistor R1 is connected to a node of the power supply voltage $V_{DD}$. The drain and gate of a NMOS 31 are connected to the other end of the resistor R1. The source of the NMOS 31 is connected to the ground potential GND. The source of a PMOS 32 is connected to the node of the power supply voltage $V_{DD}$. The gate of the PMOS 32 is connected to the other end of the resistor R1. An end of a resistor R2 is connected to the drain of the PMOS 32 and the other end of the resistor R2 is connected to the node of the ground potential. An amplifier circuit 35 comprising two inverters 33, 34 in cascade connection for generation of a detection signal $S_{POWERON}$ showing that a power supply voltage $V_{DD}$ is lower or higher than a $V_{POWERON}$ level is connected to a connection node between the drain of the PMOS 32 and the resistor R2, wherein the detection signal $S_{POWERON}$ is generated through amplification of a signal at the connection node.

The second voltage detection circuit 24 shown in FIG. 8B comprises the same circuit constitution as that of the first voltage detection circuit 23. A point at which the second voltage detection circuit 24 is different from the first one 23 is that a resistor R3 is used instead of the resistor R1 and a resistor R4 is used instead of the resistor R2. Values of the R1 to R4 are set so that they satisfy one of the following three relations:

(1) R3<R1 and R4=R2,
(2) R3=R1 and R4<R2 and
(3) R3<R1 and R4<R2 where it is assumed that the NMOS 31 and PMOS 32 are of the same size as those of the first and second voltage detection circuits 23, 24 and the respective resistances are equal.

A $V_{POWERON}$ level, which is a voltage detection level, is given by $(V_{THN}+|V_{THP}|)$, which is the sum of threshold voltages of the NMOS and the PMOS 31, 32 in the first voltage detection circuit 23 shown in FIG. 8A.

In the second voltage detection circuit 24 shown in FIG. 8B, if a resistance value is set so that the above mentioned the relation (1) R3<R1 and R4=R2 is satisfied, a larger current flows in the NMOS 31 as compared with that in the NMOS 31 in the first voltage detection circuit 23. Therefore, in a region where the NMOS 31 performs a triode operation, a gate potential (threshold voltage) of the NMOS 31 in the second voltage detection circuit 24 becomes higher than a gate potential of the NMOS 31 in the first voltage detection circuit 23. Therefore, a voltage detection level, that is $V_{POWERON}$ level, in the second voltage detection circuit 24 is higher than that of the first voltage detection circuit 23 and it assumes a value of ($V_{THN}$+|$V_{THP}$|+α) when an increment in a threshold voltage of the NMOS 31 is indicated by α.

When a resistance is set so that the relation (2) R3=R1 and R4<R2 is satisfied in the second voltage detection circuit 24, a larger current flows in the PMOS 32 as compared with the PMOS 32 in the first voltage detection circuit 23. Therefore, in a region where the PMOS 32 performs a triode operation, a threshold voltage of the PMOS 32 in the second voltage detection circuit 24 becomes higher than that of the PMOS 32 in the first voltage detection circuit 23, wherein both are compared in absolute values. Therefore, a voltage detection level, that is a $V_{POWERON}$ level, in the second voltage detection circuit 24 is higher than that in the first voltage detection circuit 23 and it assumes a value of ($V_{THN}$+|$V_{THP}$|+β) when an increment in a threshold voltage of the PMOS 32 is indicated by β.

When a resistance is set so that the relation (3) R3 <R1 and R4<R2 is satisfied in the second voltage detection circuit 24, since larger currents respectively flow in the NMOS 31 and the PMOS 32 as compared with the NMOS 31 and the PMOS 32 in the first voltage detection circuit 23, a $V_{POWERON}$ level in the second voltage detection circuit 24 in this case assumes a value of ($V_{THN}$+|$V_{THP}$|+α+β) In any one of the above mentioned three cases, a detection level in the second voltage detection circuit 24 is larger than that in the first voltage detection circuit 23. Besides, the relation of detection levels $V_{POWERON}$ $V_{LVDD}$ of a power supply voltage $V_{DD}$ in the first and second voltage detection circuits 23, 24 are not affected by a power supply voltage, an environmental temperature, a process dispersion and the like. Therefore, once resistance values of the resistors R1 to R4 are set, a relation in magnitude between the two detection levels $V_{POWERON}$, $V_{LVDD}$ of a power supply voltage $V_{DD}$ is not reversed and constant all time.

As a result, in the flash EEPROM of FIG. 6, the worst guarantee voltage in a write/erase operation can always be set at a higher value than that in a read operation and thereby wrong write/wrong erase due to reduction in a power supply voltage can be prevented from occurring.

In the first and second voltage detection circuits 23, 24 shown in FIGS. 8A, 8B, if it is required that a difference between the $V_{POWERON}$ and $V_{LVDD}$ is larger, it is only required that setting is conducted so that R3<<R1 or R4<<R2 and that values of resistors R3, R4 are lower as compared with a conductive resistance of a MOS transistor.

FIGS. 9A and 9B show other circuit constitutions of the first voltage detection circuit 23 for detecting a $V_{POWERON}$ level and the second voltage detection circuit 24 for detecting a $V_{LVDD}$ level provided in FIG. 6.

A point at which the first voltage detection circuit 23 of FIG. 9A and the second voltage detection circuit 24 of FIG. 9B are respectively different from those of FIGS. 8A, 8B is that a pn junction diode 36 is provided instead of the NMOS 31. That is, the anode of the diode 36 is connected to the other end of the resistor R1 or R3 and the cathode is connected to a node of the ground potential.

While detection levels in the circuits of FIGS. 8A, 8B are determined by ($V_{THN}$+|$V_{THP}$|) or ($V_{THN}$+|$V_{THP}$|+γ:wherein γ is α, β or α+β), a voltage level corresponding to ($V_{THN}$+|$V_{THP}$|) is (Vf+|$V_{THP}$|:wherein Vf is a voltage drop in a forward direction of a PN junction diode), in the circuits of FIGS. 9A, 9B, since the PN junction diode 36 is used instead of the NMOS 31 connected to the diode.

In this case as well, the relation of the detection levels in the first and second voltage detection circuits 23, 24 are not affected by a power supply voltage, an environmental temperature, a process dispersion and the like and once a resistance value is set, two detection levels are not reversed in their relation in magnitude.

FIGS. 10A and 10B show further circuit constitutions of the first voltage detection circuit 23 for detecting a $V_{POWERON}$ level and the second voltage detection circuit 24 for detecting a $V_{LVDD}$ level provided in FIG. 6. While one NMOS 31 is used in each of the first and second voltage detection circuit 23, 24 in FIGS. 8A, 8B, two NMOSs 31a and NMOSs 31b are inserted in series connection between the other end of the resistor R1 or R3 and the ground potential in those of FIGS. 10A, 10B and thereby the $V_{POWERON}$ level and the $V_{LVDD}$ level are further raised by a threshold voltage of the one NMOS. Furthermore, while in this embodiment, two NMOSs are in series connected between the other end of the resistor R1 or R3 and the ground potential, more than two NMOSs may be connected in series.

FIGS. 11A and 11B show still other circuit constitutions of the first voltage detection circuit 23 for detecting a $V_{POWERON}$ level and the second voltage detection circuit 24 for detecting a $V_{LVDD}$ level provided in FIG. 6. A point at which the first and second voltage detection circuits 23, 24 respectively shown in FIGS. 11A, 11B are different from those in FIGS. 10A, 10B is in that two pn junction diodes 36a, 36b connected in series are used instead of the two NMOSs 31a, 31b.

In this case, a $V_{POWERON}$ level and a $V_{LVDD}$ level are increased by a voltage drop in a forward direction of one diode as compared with those in the cases of FIGS. 9A, 9B. As similar to the cases of FIGS. 10A, 10B, more than two diodes may be inserted in a serial connection between the other end of a resistor R1 or R3 and the ground potential.

FIGS. 12 shows another circuit constitution of the second voltage detection circuit 24 for detecting a $V_{LVDD}$ level provided in FIG. 6. In the case where the second voltage detection circuit 24 shown in FIG. 12 is used, the first voltage detection circuit 23 shown in FIG. 8A is used as a first voltage detection circuit 23. The second voltage detection circuit 24 of FIG. 12 is different from the first voltage detection circuit of FIG. 8A in that serially connected two resistors R11, R12 are used instead of the resistor R1, the gate of the PMOS 32 is connected to a serial connection node between the resistors R11, R12. A serial resistance of R11 and R12 is equal to a resistance value of R1.

In the second voltage detection circuit 24, a potential difference between the power supply voltage $V_{DD}$ and a gate potential $V_{THN}$ of the NMOS 31, that is ($V_{DD}$−$V_{THN}$), is divided on two resistors and a part of the potential difference is applied to the gate of the PMOS 32. Therefore, the power supply voltage detection level $V_{LVDD}$ is larger as compared with the detection level $V_{POWERON}$ in the first voltage detection circuit 23 of FIG. 8A. The detection level $V_{POWERON}$ is given by the following equation:

$V_{LVDD}$=$V_{THN}$+{(R11+R12)/R11}|$V_{THP}$|=$V_{POWERON}$+(R12/R11)|$V_{THP}$|

FIG. 13 shows still another circuit constitution of the second voltage detection circuit 24 for detecting a $V_{LVDD}$ level provided in FIG. 6. In the case where a second voltage detection circuit 24 shown in FIG. 13 is used, the first voltage detection circuit 23 shown in FIG. 9 is used as a first voltage detection circuit 23. The second voltage detection circuit 24 of FIG. 13 is different from the first voltage detection circuit 23 of FIG. 9 in that serially connected two resistors R11, R12 are used instead of the resistor R1 and the gate of the PMOS 32 is connected to a serial connection node between the resistors R11, R12. In this case, a serial resistance value of the R11 and R12 is equal to a resistance value of R1.

The voltage detection circuit 24 shown in FIG. 13 is different from that of FIG. 12 in that the NMOS 31 is replaced with a diode 36, thus the function of the circuit can be considered in a similar way to that of FIG. 12 and a $V_{LVDD}$ level higher than a $V_{POWERON}$ can be obtained.

While the circuits shown in FIGS. 12 and 13 have been described on the cases where they are employed as the second voltage detection circuit 24, they can be applied to use as the first voltage detection circuit 23 if the ratio between resistance values of resistors R11, R12 is changed. This is preferred in the case where there is a desire that detection levels of the first and second voltage detection circuits 23, 24 are set at a value equal to or higher than $(V_{THN}+|V_{THP}|)$.

That is, two circuits, respectively shown in FIG. 12 or FIG. 13, are adopted and one of the two circuits can be used as a first voltage detection circuit 23 for detecting a $V_{POWERON}$ level and the other can be used as a second voltage detection circuit 24 for detecting a $V_{LVDD}$ level. In this case, if it is set so that the value of a ratio between the resistance values of the resistors R11 and R12, that is (R12/R11), in the first voltage detection circuit for detecting $V_{POWERON}$ is lower than the value of a ratio between the resistance values of the resistors R11 and R12, that is (R12/R11), in the second voltage detection circuit for detecting $V_{LVDD}$, a relation $V_{POWERON}<V_{LVDD}$ can be obtained.

Thereby, a time constant in the second voltage detection circuit is shorter as compared with that in the first voltage circuit and thus a higher speed in operation can be achieved.

While the voltage detection circuits shown in FIGS. 8A, 8B to 13 are separately provided for respective uses detecting a $V_{POWERON}$ level and a $V_{LVDD}$ level, there is necessarily no need for the separation.

FIG. 14 is a block diagram showing a constitution of the inside of a flash EEPROM chip according to a second embodiment of the present invention. The second embodiment employs one voltage detection circuit 27 in which the first and second voltage detection circuits 23, 24 are partly incorporated.

Figure 15:
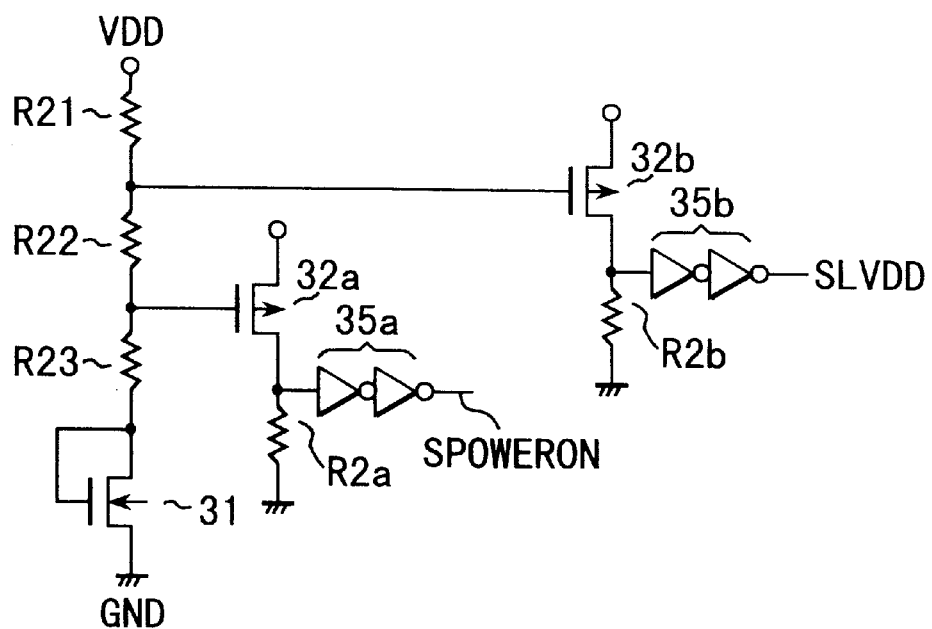
FIG. 15 is a circuit diagram of a voltage detection circuit used in the flash EEPROM of FIG. 14.
Figure 16:
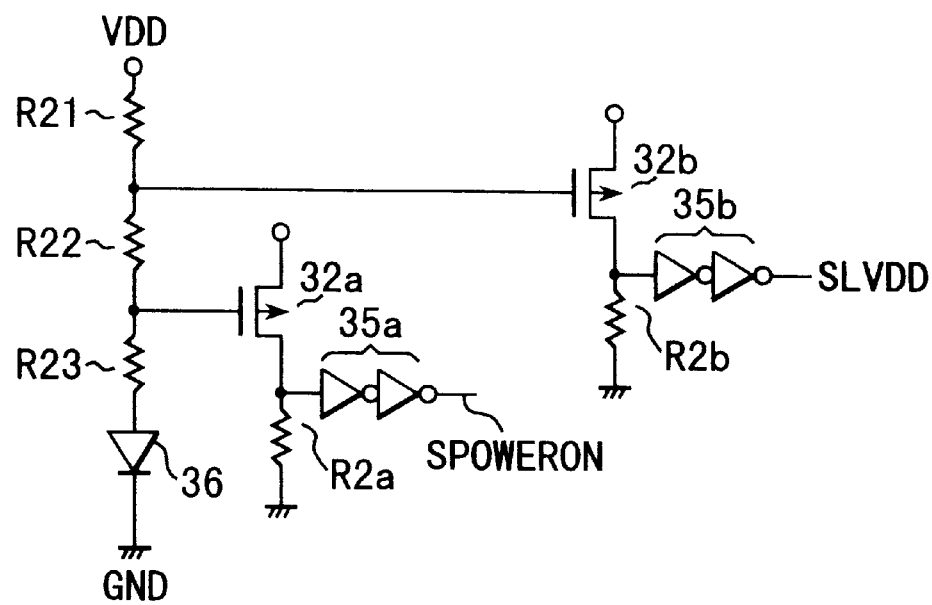
FIG. 16 is another circuit diagram of the voltage detection circuit used in the flash EEPROM of FIG. 14.

In the embodiment, as a voltage detection circuit 27, for example one of constitutions as shown in FIG. 15 or 16 is used.

The voltage detection circuit 27 shown in FIG. 15 comprises: three resistors R21, R22, R23, which are connected in series, used instead of the resistor R1 in the voltage detection circuit of FIG. 8A; and a circuit comprising a PMOS 32a, a resistor R2a and an amplifier circuit 35a used as an equivalent to the circuit comprising the PMOS 32, R2 and amplifier circuit 35a for generating a detection signal $S_{POWERON}$. Furthermore, the voltage detection circuit 27 comprises a circuit comprising a PMOS 32b, a resistor R2b and an amplifier circuit 35b as an equivalent to a circuit comprising the PMOS 32, R4 and amplifier circuit 35b for generating the detection signal $S_{LVDD}$. The gate of the PMOS 32a is supplied with a voltage at the serial connection node between the resistors R22 and R23 and the gate of the PMOS 32b is supplied with a voltage at the serial connection node between the resistors R21 and R22.

In such a circuit, there can be produced the detection signals of $S_{POWERON}$ and $S_{LVDD}$, which are different from each other in detection level as well.

A voltage detection circuit shown in FIG. 16 is different from the voltage detection circuit of FIG. 15 only in that a pn junction diode 36 is used instead of the NMOS 31 in the voltage detection circuit of FIG. 15.

While descriptions in the examples of FIGS. 15, 16 are made in the cases where the three resistors R21, R22, R23 are in series connected between the power supply voltage $V_{DD}$ and the drain of the NMOS 31 or the anode of the diode 36, more than three resistors may in series be connected.

While in the above embodiments, the case of a flash EEPROM is described as an example of a semiconductor integrated circuit in which all the functions of a circuit are ceased at a power supply voltage of a value or lower, a part of the function is ceased at a power supply voltage of a higher value and all the function are operable at a power supply voltage of a sufficiently further higher value, it is needless to say that the case can be applicable to any semiconductor integrated circuit as far as it is a semiconductor integrated circuit performing a control of circuit functions by detecting a power supply voltage with two voltage levels.

As described above, according to the present invention, in a semiconductor integrated circuit in which a control of circuit functions is performed by detecting a power supply voltage with two voltage levels, a relation in magnitude between the two voltage levels is not reversed by a power supply voltage level which guarantees an operation and thereby a wrong operation is prevented from occurring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit having a power supply voltage detecting function comprising:

a power supply terminal receiving a power supply voltage from an outside;

a first voltage detection circuit, which receives the power supply voltage given to the power supply terminal, in which a detection result is obtained on whether a value of the power supply voltage is lower or higher than a first voltage, and from which a first signal according to the detection result is output;

a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output;

an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage, wherein the first and second detection circuits each comprises at least two MOS transistors, two resistors and a constitution in which the power supply voltage is detected based on a sum of threshold voltages of the at least two MOS transistors and the first and second detection circuits each further comprise a constitution in which voltages, which are different from each other, are detected according to setting of values of the resistors.

2. A semiconductor integrated circuit having a power supply voltage detection function comprising:

a power supply terminal receiving a power supply voltage from an outside;

a first voltage detection circuit, which receives the power supply voltage given to the power supply terminal, in which a detection result is obtained on whether a value of the power supply voltage is lower or higher than a first voltage, and from which a first signal according to the detection result is output;

a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output;

an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of internal circuit when the first signal corresponds to a case where the value of the power supply voltage is higher than the first voltage and the second signal corresponds to a case where the value of the power supply voltage is lower than the second voltage, wherein the first and second detection circuits each comprises one MOS transistor, at least one diode and two resistors and a constitution in which the power supply voltage is detected based on a sum of a threshold voltage of the MOS transistor and a voltage drop in the at least one diode and the first and second detection circuits each further comprise a constitution in which voltages, which are different from each other, are detected according to setting of values of the resistors.

3. A semiconductor integrated circuit according to claim 1, wherein the first and second voltage detection circuits have the same circuit constitution.

4. A semiconductor integrated circuit according to claim 2, wherein the first and second voltage detection circuits have the same circuit constitution.

5. A semiconductor integrated circuit according to claim 1, wherein the internal circuit is a memory circuit including a flash memory cell, and a function to cease at a power supply less than the second voltage is a data write function to the flash memory cell and a data erase function for the flash memory cell.

6. A semiconductor integrated circuit according to claim 2, wherein the internal circuit is a memory circuit including a flash memory cell, and a function to cease at a power supply less than the second voltage is a data write function to the flash memory cell and a data erase function for the flash memory cell.

7. A semiconductor integrated circuit according to claim 3, wherein the first and second voltage detection circuits each comprise:

a first resistor, an end thereof being connected to the power supply terminal;

at least one first MOS transistor of a first polarity type, an end of a current path between a source and drain thereof being connected to a gate thereof, and the current path between the source and drain thereof being inserted between the other end of the first resistor and a node of a reference potential;

a second MOS transistor of a second polarity type, an end of a current path between a source and drain thereof being connected to the power supply terminal, and a gate thereof being connected to the other end of the first resistor; and a second resistor connected to between the other end of the current path between the source and drain of the second MOS transistor and a node of the reference potential.

8. A semiconductor integrated circuit according to claim 7, wherein a resistance value of at least one of the first and second resistors in the first voltage detection circuit is set so as to be larger than a resistance value of the first or second resistor in the second voltage detection circuit whichever corresponds to the at least one of the first and second resistors in the first voltage detection circuit.

9. A semiconductor integrated circuit according to claim 7, wherein each of the first and second voltage detection circuits further comprises an amplifier circuit in which the first and second signals are generated through amplification of a signal at a connection node between the other end of the current path between the source and drain of the second MOS transistor and the second resistor.

10. A semiconductor integrated circuit according to claim 4, wherein the first and second voltage detection circuits each comprises:

a first resistor, an end thereof being connected to the power supply terminal;

at least one diode, a current path between an anode and cathode thereof being inserted between the other end of the first resistor and a node of the reference potential;

a MOS transistor, an end of a current path between a source and drain thereof being connected to the power supply terminal, and a gate thereof being connected to the other end of the first resistor; and a second resistor connected to between the other end of the current path between the source and drain of the MOS transistor and a node of the reference potential.

11. A semiconductor integrated circuit according to claim 10, wherein a resistance value of at least one of the first and second resistors in the first voltage detection circuit is set so as to be larger than a resistance value of the first or second resistor in the second voltage detection circuit whichever corresponds to the at least one of the first and second resistors in the first voltage detection circuit.

12. A semiconductor integrated circuit according to claim 10, wherein each of the first and second voltage detection circuits further comprises an amplifier circuit in which the first and second signals are generated through amplification of a signal at a connection node between the other of the current path between the source and drain of the MOS transistor and the second resistor.

13. A semiconductor integrated circuit according to claim 1, wherein the first and second voltage detection circuits each comprises:
a first resistor, an end thereof being connected to the power supply terminal;
a second resistor, an end thereof being connected to the other end of the first resistor;
a first MOS transistor of a first polarity type, an end of a current path between a source and drain thereof being connected to a gate thereof, and the current path between the source and drain thereof being connected between the other end of the second resistor and a node of a reference potential;
a second MOS transistor of a second polarity type, an end of a current path between a source and drain thereof being connected to the power supply terminal, and a gate thereof being connected to a connection node between the first and second resistors; and
a third resistor connected between the other end of the current path between the source and drain of the second MOS transistor and a node of the reference potential, wherein when resistance values of the first and second resistors in each of the first and second voltage detection circuits are respectively indicated by R11, R12, a value of a ratio of R12/R11 in the first voltage detection circuit is set to be smaller as compared with a value of a ratio of R12/R11 in the second voltage detection circuit.

14. A semiconductor integrated circuit according to claim 2, wherein the first and second voltage detection circuits each comprises:
a first resistor, an end thereof being connected to the power supply terminal;
a second resistor, an end thereof being connected to the other end of the first resistor;
a diode, an end of a current path between an anode and cathode thereof being connected to the other end of the second resistor and the other end of the current path thereof being connected to a node of the reference potential;
a MOS transistor, an end of a current path between a source and drain thereof being connected to the power supply terminal, and a gate thereof being connected to a connection node between the first and second resistors; and
a third resistor connected between the other end of the current path between the source and drain of the MOS transistor and a node of the reference potential, wherein when resistance values of the first and second resistors in each of the first and second voltage detection circuits are respectively indicated by R11, R12, a value of a ratio of R12/R11 in the first voltage detection circuit is set to be smaller as compared with a value of a ratio of R12/R11 in the second voltage detection circuit.

15. A semiconductor integrated circuit according to claim 1, wherein the first voltage detection circuit comprises:
a first resistor, an end thereof being connected to the power supply terminal;
a first MOS transistor of a first polarity type, an end of a current path between a source and drain thereof being connected to the other end of the first resistor, a gate thereof being also connected to the same other end of the first resistor, and the other end of the current path between the source and drain thereof being connected to a node of the reference potential;
a second MOS transistor of a second polarity type, an end of a current path between a source and drain thereof being connected to the power supply terminal, and a gate thereof being connected to the other end of the first resistor; and
a second resistor connected between the other end of the current path between the source and drain of the second MOS transistor and a node of the reference potential,
and the second voltage detection circuit comprises:
a third resistor, an end of thereof being connected to the power supply terminal;
a fourth resistor, an end thereof being connected to the other end of the third resistor;
a third MOS transistor of the first polarity type, an end of a current path between a source and drain thereof being connected to the other end of the fourth resistor, a gate thereof being also connected to the same other end of the fourth resistor, and the other end of the current path of the source and drain thereof being connected to a node of the reference potential;
a fourth MOS transistor of the second polarity type, an end of a current path between a source and drain thereof being connected to the power supply terminal, and a gate thereof being connected to the other end of the third resistor; and
a fifth resistor connected between the other end of the current path between the source and drain of the fourth MOS transistor and a node of the reference potential.

16. A semiconductor integrated circuit according to claim 15, wherein the first voltage detection circuit further comprises a first amplifier circuit generating the first signal through amplification of a signal at a connection node between the other end of the current path between the source and drain of the second MOS transistor and the second resistor and the second voltage detection circuit further comprises a second amplifier circuit generating the second signal through amplification of a signal at a connection node between the other end of the current path between the source and drain of the fourth MOS transistor and the fifth resistor.

17. A semiconductor integrated circuit according to claim 2, wherein the first voltage detection circuit comprises:
a first resistor, an end thereof being connected to the power supply terminal;
a first diode, an end of a current path between an anode and cathode thereof being connected to the other end of the first resistor and the other end of the current path thereof being connected to a node of a reference potential;
a first MOS transistor, an end of a current path between a source and drain thereof being connected to the power supply terminal and a gate thereof being connected to the other end of the first resistor;
a second resistor connected between the other end of a current path between the source and drain of the first MOS transistor and a node of the reference potential,
and the second voltage detection circuit comprises:
a third resistor, an end thereof being connected to the power supply terminal;
a fourth resistor, an end thereof being connected to the other end of the third resistor;
a second diode, an end of a current path between an anode and cathode thereof being connected to the other end of the fourth resistor and the other end of the current path thereof being connected to a node of the reference potential;

a second MOS transistor of the same polarity type as that of the first MOS transistor, an end of a current path between a source and drain thereof being connected to the power supply terminal and a gate thereof being connected to the other end of the third resistor; and a fifth resistor connected between the other end of the current path between the source and drain of the second MOS transistor and a node of the reference potential.

18. A semiconductor integrated circuit according to claim 17, wherein the first voltage detection circuit further comprises a first amplifier circuit generating the first signal through amplification of a signal at a connection node between the other end of the current path between the source and drain of the first MOS transistor and the second resistor and the second voltage detection circuit further comprises a second amplifier circuit generating the second signal through amplification of a signal at a connection node between the other end of the current path between the source and drain of the second MOS transistor and the fifth resistor.

19. A semiconductor integrated circuit having a power supply voltage detecting function comprising:

a power supply terminal receiving a power supply voltage from an outside; and a voltage detection circuit, which receives the power supply voltage given to the power supply terminal, in which a detection result is obtained on whether a value of the power supply voltage is lower or higher than a first voltage, and from which a first signal according to the detection result is output; in which a detection result is further obtained on whether the value of the power supply voltage is lower or higher than a second voltage higher than the first voltage, and from which a second signal according to the detection result is output, wherein the voltage detection circuit comprises:

at least three first resistors connected in series between the power supply voltage and a first node;

a first MOS transistor of a first polarity type, a current path between a source and drain thereof being connected between the first node and a node of a reference potential, and a gate thereof being connected to the first node;

a second MOS transistor of a second polarity type, an end of a current path between a source and drain thereof being connected to the power supply terminal, and a gate thereof being connected to a first serial connection node located in a side closer to the first node among the serial connection nodes of the at least three first resistors;

a second resistor, an end thereof being connected to the other end of the current path of the source and drain of the second MOS transistor, and the other end thereof being connected to a node of the reference potential, and generating the first signal through the end of the second resistor;

a third MOS transistor of the second polarity type, an end of a current path between a source and drain thereof being connected to the power supply terminal, and a gate thereof being connected to a second serial connection node different from the first serial connection node, located in a side closer to the power supply voltage among the serial connection nodes of the at least three first resistors; and a third resistor, an end thereof being connected to the other end of the current path between the source and drain of the third MOS transistor, and the other end thereof being connected to a node of the reference potential, and generating the second signal through the end of the third resistor, and the semiconductor integrated circuit further comprising:

an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage.

20. A semiconductor integrated circuit having a power supply voltage detecting function comprising:

a power supply terminal receiving a power supply voltage from an outside; and a voltage detection circuit, which receives the power supply voltage given to the power supply terminal, in which a detection result is obtained on whether a value of the power supply voltage is lower or higher than a first voltage, and from which a first signal according to the detection result is output; in which a detection result is further obtained on whether the value of the power supply voltage is lower or higher than a second voltage higher than the first voltage, and from which a second signal according to the detection result is output, wherein the voltage detection circuit comprises:

at least three first resistors connected in series between the power supply voltage and a first node;

a diode, an end of a current path between an anode and cathode thereof being connected to the first node and the other end of the current path thereof being connected to a node of a reference potential;

a first MOS transistor, an end of a current path between a source and drain thereof being connected to the power supply terminal, and a gate thereof being connected to a first serial connection node located in a side closer to the first node among the serial connection nodes of the at least three first resistors;

a second resistor, an end thereof being connected to the other end of the current path of the source and drain of the first MOS transistor, and the other end thereof being connected to a node of the reference potential, and generating the first signal through the end of the second resistor;

a second MOS transistor of the same polarity type as that of the first MOS transistor, an end of a current path between a source and drain thereof being connected to the power supply terminal, and a gate thereof being connected to a second serial connection node different from the first serial connection node, located in a side closer to the power supply voltage among the serial connection nodes of the at least three first resistors;

a third resistor, an end thereof being connected to the other end of the current path between the source and drain of the second MOS transistor, and the other end thereof being connected to a node of the reference potential, and generating the second signal through the end of the third resistor; and the semiconductor integrated circuit further comprising:

an internal circuit which is operable by receiving the power supply voltage given to the power supply terminal; and a control circuit, which receives the first and second signals, and which conducts a control in such a manner that the control circuit ceases all functions of the internal circuit when the first signal corresponds to a case where the value of the power supply voltage is lower than the first voltage, and ceases a part of the functions of the internal circuit when the first signal corresponds to a case where the value of the power supply voltage is higher than the first voltage and the second signal corresponds to a case where the value of the power supply voltage is lower than the second voltage.

21. A semiconductor integrated circuit according to claim 19, wherein the internal circuit is a memory circuit including a flash memory cell, and a function to cease at a power supply less than the second voltage is a data write function to the flash memory cell and a data erase function for the same flash memory cell.

22. A semiconductor integrated circuit according to claim 20, wherein the internal circuit is a memory circuit including a flash memory cell, and a function to cease at a power supply less than the second voltage is a data write function to the flash memory cell and a data erase function for the same flash memory cell.

23. A semiconductor integrated circuit having a power supply voltage detecting function comprising:

a power supply terminal receiving a power supply voltage from an outside;

a first voltage detection circuit, which receives the power supply voltage given to the power supply terminal, in which a detection result is obtained on whether a value of the power supply voltage is lower or higher than a first voltage, and from which a first signal according to the detection result is output;

a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output;

an internal circuit which is operable by receiving the power supply voltage given to the power supply terminal; and a control circuit, which receives the first and second signals, and which conducts a control in such a manner that the control circuit makes a first part of functions of the internal circuit active when the first signal corresponds to a case where a value of the power supply voltage is higher than the first voltage and the second signal corresponds to a case where the value of the power supply voltage is lower than the second voltage, and makes at least a second part of the functions of the internal circuit active when the first signal corresponds to a case where a value of the power supply voltage is higher than the first voltage and the second signal corresponds to a case where the value of the power supply voltage is higher than the second voltage, wherein the first and second detection circuits each comprises at least two MOS transistors, two resistors and a constitution in which the power supply voltage is detected based on a sum of threshold voltages of the at least two MOS transistors and the first and second detection circuits each further comprise a constitution in which voltages, which are different from each other, are detected according to setting of values of the resistors.

24. A semiconductor integrated circuit having a power supply voltage detection function comprising:

a power supply terminal receiving a power supply voltage from an outside;

a first voltage detection circuit, which receives the power supply voltage given to the power supply terminal, in which a detection result is obtained on whether a value of the power supply voltage is lower or higher than a first voltage, and from which a first signal according to the detection result is output;

a second voltage detection circuit, which receives the power supply voltage given to the power supply terminal, in which a detection result is obtained on whether the value of the power supply voltage is lower or higher than a second voltage higher than the first voltage, and from which a second signal according to the detection result is output;

an internal circuit which is operable by receiving the power supply voltage given to the power supply terminal; and a control circuit, which receives the first and second signals, and which conducts a control in such a manner that the control circuit makes a first part of functions of the internal circuit active when the first signal corresponds to a case where a value of the power supply voltage is higher than the first voltage and the second signal corresponds to a case where the value of the power supply voltage is lower than the second voltage, and makes at least a second part of the functions of the internal circuit active when the first signal corresponds to a case where a value of the power supply voltage is higher than the first voltage and the second signal corresponds to a case where the value of the power supply voltage is higher than the second voltage, wherein the first and second detection circuits each comprises one MOS transistor, at least one diode and two resistors and a constitution in which the power supply voltage is detected based on a sum of a threshold voltage of the MOS transistor and a voltage drop in the at least one diode and the first and second detection circuits each further comprise a constitution in which voltages, which are different from each other, are detected according to setting of values of the resistors.

25. A semiconductor integrated circuit according to claim 23, wherein the first and second voltage detection circuits have the same circuit constitution.

26. A semiconductor integrated circuit according to claim 24, wherein the first and second voltage detection circuits have the same circuit constitution.

27. A semiconductor integrated circuit according to claim 23, wherein the internal circuit is a memory circuit including a flash memory cell, and a function to cease at a power supply less than the second voltage is a data write function to the flash memory cell and a data erase function for the flash memory cell.

28. A semiconductor integrated circuit according to claim 24, wherein the internal circuit is a memory circuit including a flash memory cell, and a function to cease at a power supply less than the second voltage is a data write function to the flash memory cell and a data erase function for the flash memory cell.

29. A semiconductor integrated circuit according to claim 25, wherein the first and second voltage detection circuits each comprise:
   a first resistor, an end thereof being connected to the power supply terminal;
   at least one first MOS transistor of a first polarity type, an end of a current path between a source and drain thereof being connected to a gate thereof, and the current path between the source and drain thereof being inserted between the other end of the first resistor and a node of a reference potential;
   a second MOS transistor of a second polarity type, an end of a current path between a source and drain thereof being connected to the power supply terminal, and a gate thereof being connected to the other end of the first resistor; and
   a second resistor connected to between the other end of the current path between the source and drain of the second MOS transistor and a node of the reference potential.

30. A semiconductor integrated circuit according to claim 29, wherein a resistance value of at least one of the first and second resistors in the first voltage detection circuit is set so as to be larger than a resistance value of the first or second resistor in the second voltage detection circuit whichever corresponds to the at least one of the first and second resistors in the first voltage detection circuit.

31. A semiconductor integrated circuit according to claim 29, wherein each of the first and second voltage detection circuits further comprises an amplifier circuit in which the first and second signals are generated through amplification of a signal at a connection node between the other end of the current path between the source and drain of the second MOS transistor and the second resistor.

32. A semiconductor integrated circuit according to claim 26, wherein the first and second voltage detection circuits each comprises:
   a first resistor, an end thereof being connected to the power supply terminal;
   at least one diode, a current path between an anode and cathode thereof being inserted between the other end of the first resistor and a node of the reference potential;
   a MOS transistor, an end of a current path between a source and drain thereof being connected to the power supply terminal, and a gate thereof being connected to the other end of the first resistor; and
   a second resistor connected to between the other end of the current path between the source and drain of the MOS transistor and a node of the reference potential.

33. A semiconductor integrated circuit according to claim 32, wherein a resistance value of at least one of the first and second resistors in the first voltage detection circuit is set so as to be larger than a resistance value of the first or second resistor in the second voltage detection circuit whichever corresponds to the at least one of the first and second resistors in the first voltage detection circuit.

34. A semiconductor integrated circuit according to claim 32, wherein each of the first and second voltage detection circuits further comprises an amplifier circuit in which the first and second signals are generated through amplification of a signal at a connection node between the other of the current path between the source and drain of the MOS transistor and the second resistor.

35. A semiconductor integrated circuit according to claim 23, wherein the first and second voltage detection circuits each comprises:
   a first resistor, an end thereof being connected to the power supply terminal;
   a second resistor, an end thereof being connected to the other end of the first resistor;
   a first MOS transistor of a first polarity type, an end of a current path between a source and drain thereof being connected to a gate thereof, and the current path between the source and drain thereof being connected between the other end of the second resistor and a node of a reference potential;
   a second MOS transistor of a second polarity type, an end of a current path between a source and drain thereof being connected to the power supply terminal, and a gate thereof being connected to a connection node between the first and second resistors; and
   a third resistor connected between the other end of the current path between the source and drain of the second MOS transistor and a node of the reference potential, wherein when resistance values of the first and second resistors in each of the first and second voltage detection circuits are respectively indicated by R11, R12, a value of a ration of R12/R11 in the first voltage detection circuit is set to be smaller as compared with a value of a ratio of R12/R11 in the second voltage detection circuit.

36. A semiconductor integrated circuit according to claim 24, wherein the first and second voltage detection circuits each comprises:
   a first resistor, an end thereof being connected to the power supply terminal;
   a second resistor, an end thereof being connected to the other end of the first resistor;
   a diode, an end of a current path between an anode and cathode thereof being connected to the other end of the second resistor and the other end of the current path thereof being connected to a node of the reference potential;
   a MOS transistor, an end of a current path between a source and drain thereof being connected to the power supply terminal, and a gate thereof being connected to a connection node between the first and second resistors; and
   a third resistor connected between the other end of the current path between the source and drain of the MOS transistor and a node of the reference potential, wherein when resistance values of the first and second resistors in each of the first and second voltage detection circuits are respectively indicated by R11, R12, a value of a ratio of R12/R11 in the first voltage detection circuit is set to be smaller as compared with a value of ratio of R12/R11 in the second voltage detection circuit.

37. A semiconductor integrated circuit according to claim 23, wherein the first voltage detection circuit comprises:
   a first resistor, and end thereof being connected to the power supply terminal;
   a first MOS transistor of a first polarity type, an end of a current path between a source and drain thereof being connected to the other end of the first resistor, a gate thereof being also connected to the same other end of the first resistor, and the other end of the current path between the source and drain thereof being connected to a node of the reference potential;

a second MOS transistor of a second polarity type, and end of a current path between a source and drain thereof being connected to the power supply terminal, and a gate thereof being connected to the other end of the first resistor; and a second resistor connected between the other end of the current path between the source and drain of the second MOS transistor and a node of the reference potential, and the second voltage detection circuit comprises:

a third resistor, an end of thereof being connected to the power supply terminal;

a fourth resistor, an end thereof being connected to the other end of the third resistor;

a third MOS transistor of the first polarity type, an end of a current path between a source and drain thereof being connected to the other end of the fourth resistor, a gate thereof being also connected to the same other end of the fourth resistor, and the other end of the current path of the source and drain thereof being connected to a node of the reference potential;

a fourth MOS transistor of the second polarity type, an end of a current path between a source and drain thereof being connected to the power supply terminal, and a gate thereof being connected to the other end of the third resistor; and a fifth resistor connected between the other end of the current path between the source and drain of the fourth MOS transistor and a node of the reference potential.

38. A semiconductor integrated circuit according to claim 37, wherein the first voltage detection circuit further comprises a first amplifier circuit generating the first signal through amplification of a signal at a connection node between the other end of the current path between the source and drain of the second MOS transistor and the second resistor and the second voltage detection circuit further comprises a second amplifier circuit generating the second signal through amplification of a signal at a connection node between the other end of the current path between the source and drain of the fourth MOS transistor and the fifth resistor.

39. A semiconductor integrated circuit according to claim 24, wherein the first voltage detection circuit comprises:

a first resistor, an end thereof being connected to the power supply terminal;

a first diode, an end of a current path between an anode and cathode thereof being connected to the other end of the first resistor and the other end of the current path thereof being connected to a node of a reference potential;

a first MOS transistor, an end of a current path between a source and drain thereof being connected to the power supply terminal and a gate thereof being connected to the other end of the first resistor;

a second resistor connected between the other end of a current path between the source and drain of the first MOS transistor and a node of the reference potential, and the second voltage detection circuit comprises:

a third resistor, an end thereof being connected to the power supply terminal;

a fourth resistor, an end thereof being connected to the other end of the third resistor;

a second diode, an end of a current path between an anode and cathode thereof being connected to the other end of the fourth resistor and the other end of the current path thereof being connected to a node of the reference potential;

a second MOS transistor of the same polarity type as that of the first MOS transistor, an end of a current path between a source and drain thereof being connected to the power supply terminal and a gate thereof being connected to the other end of the third resistor; and a fifth resistor connected between the other end of the current path between the source and drain of the second MOS transistor and a node of the reference potential.

40. A semiconductor integrated circuit according to claim 39, wherein the first voltage detection circuit further comprises a first amplifier circuit generating the first signal through amplification of a signal at a connection node between the other end of the current path between the source and drain of the first MOS transistor and the second resistor and the second voltage detection circuit further comprises a second amplifier circuit generating the second signal through amplification of a signal at a connection node between the other end of the current path between the source and drain of the second MOS transistor and the fifth resistor.

41. A semiconductor integrated circuit having a power supply voltage detecting function comprising:

a power supply terminal receiving a power supply voltage from an outside; and a voltage detection circuit, which receives the power supply voltage given to the power supply terminal, in which a detection result is obtained on whether a value of the power supply voltage is lower or higher than a first voltage, and from which a first signal according to the detection result is output; in which a detection result is further obtained on whether the value of the power supply voltage is lower or higher than a second voltage higher than the first voltage, and from which a second signal according to the detection result is output, wherein the voltage detection circuit comprises:

at least three first resistors connected in series between the power supply voltage and a first node;

a first MOS transistor of a first polarity type, a current path between a source and drain thereof being connected between the first node and a node of a reference potential, and a gate thereof being connected to the first node;

a second MOS transistor of a second polarity type, an end of a current path between a source and a drain thereof being connected to the power supply terminal, and a gate thereof being connected to a first serial connection node located in a side closer to the first node among the serial connection nodes of the at least three first resistors;

a second resistor, an end thereof being connected to the other end of the current path of the source and drain of the second MOS transistor, and the other end thereof being connected to a node of the reference potential, and generating the first signal through the end of the second resistor;

a third MOS transistor of the second polarity type, an end of a current path between a source and drain thereof being connected to the power supply terminal, and a gate thereof being connected to a second serial connection node different from the first serial connection node, located in a side closer to the power supply voltage among the serial connection nodes of the at least three first resistors; and a third resistor, an end thereof being connected to the other end of the current path between the source and drain of the third MOS transistor, and the other end thereof being connected to a node of the reference potential, and generating the second signal through the end of the third resistor, and the semiconductor integrated circuit further comprising:

an internal circuit which is operable by receiving the power supply voltage given to the power supply terminal; and a control circuit, which receives the first and second signals, and which conducts a control in such a manner that the control circuits makes a first part of functions of the internal circuit active when the first signal corresponds to a case where a value of the power supply voltage is higher than the first voltage and the second signal corresponds to a case where the value of the power supply voltage is lower than the second voltage, and makes at least a second part of the functions of the internal circuit active when the first signal corresponds to a case where a value of the power supply voltage is higher than the first voltage and the second signal corresponds to a case where the value of the power supply voltage is higher than the second voltage.

42. A semiconductor integrated circuit having a power supply voltage detecting function comprising:

a power supply terminal receiving a power supply voltage from an outside; and a voltage detection circuit, which receives the power supply voltage given to the power supply terminal, in which a detection result is obtained on whether a value of the power supply voltage is lower or higher than a first voltage, and from which a first signal according to the detection result is output, in which a detection result is further obtained on whether the value of the power supply voltage is lower or higher than a second voltage higher than the first voltage, and from which a second signal according to the detection result is output, wherein the voltage detection circuit comprises:

at least three first resistors connected in series between the power supply voltage and a first node;

a diode, an end of a current path between an anode and cathode thereof being connected to the first node and the other end of the current path thereof being connected to a node of a reference potential;

a first MOS transistor, an end of a current path between a source and drain thereof being connected to the power supply terminal, and a gate thereof being connected to a first serial connection node located in a side closer to the first node among the serial connection nodes of the at least three first resistors;

a second resistor, an end thereof being connected to the other end of the current path of the source and drain of the first MOS transistor, and the other end thereof being connected to a node of the reference potential, and generating the first signal through the end of the second resistor;

a second MOS transistor of the same polarity type as that of the first MOS transistor, an end of a current path between a source and drain thereof being connected to the power supply terminal, and a gate thereof being connected to a second serial connection node different from the first serial connection node, located in a side closer to the power supply voltage among the serial connection nodes of the at least three first resistors;

a third resistor, an end thereof being connected to the other end of the current path between the source and drain of the second MOS transistor, and the other end thereof being connected to a node of the reference potential, and generating the second signal through the end of the third resistor; and the semiconductor integrated circuit further comprising:

an internal circuit which is operable by receiving the power supply voltage given to the power supply terminal; and a control circuit, which receives the first and second signals, and which conducts a control in such a manner that the control circuit makes a first part of functions of the internal circuit active when the first signal corresponds to a case where a value of the power supply voltage is higher than the first voltage and the second signal corresponds to a case where the value of the power supply voltage is lower than the second voltage, and makes at least a second part of the functions of the internal circuit active when the first signal corresponds to a case where a value of the power supply voltage is higher than the first voltage and the second signal corresponds to a case where the value of the power supply voltage is higher than the second voltage.

43. A semiconductor integrated circuit according to claim 41, wherein the internal circuit is a memory circuit including a flash memory cell, and a function to cease at a power supply less than the second voltage is a data write function to the flash memory cell and a data erase function for the same flash memory cell.

44. A semiconductor integrated circuit according to claim 42, wherein the internal circuit is a memory circuit including a flash memory cell, and a function to cease at a power supply less than the second voltage is a data write function to the flash memory cell and a data erase function for the same flash memory cell.

* * * * *